(12) United States Patent
Hong

(10) Patent No.: US 7,319,062 B2
(45) Date of Patent: Jan. 15, 2008

(54) TRENCH ISOLATION METHOD WITH AN EPITAXIALLY GROWN CAPPING LAYER

(75) Inventor: Sug-hun Hong, Seoul (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 1769 days.

(21) Appl. No.: 09/842,049

(22) Filed: Apr. 26, 2001

(65) Prior Publication Data

US 2001/0015046 A1 Aug. 23, 2001

Related U.S. Application Data

(62) Division of application No. 09/324,919, filed on Jun. 3, 1999, now Pat. No. 6,255,194.

(51) Int. Cl.
*H01L 21/76* (2006.01)

(52) U.S. Cl. ............ 438/437; 438/435; 438/424; 257/E21.546

(58) Field of Classification Search ............ 438/424, 438/435, 437; 257/E21.546, E21.56
See application file for complete search history.

(56) References Cited

U.S. PATENT DOCUMENTS

| | | | |
|---|---|---|---|
| 4,631,803 A | 12/1986 | Hunter et al. ............ 438/426 |
| 5,236,863 A * | 8/1993 | Iranmanesh ............... 438/429 |
| 5,244,827 A | 9/1993 | Dixit et al. ............... 438/431 |
| 5,436,488 A * | 7/1995 | Poon et al. ............... 257/397 |
| 5,447,884 A * | 9/1995 | Fahey et al. ............. 438/437 |
| 5,604,159 A | 2/1997 | Cooper .................... 438/430 |
| 5,747,866 A | 5/1998 | Ho et al. .................. 257/506 |
| 5,780,346 A | 7/1998 | Arghavani et al. ........ 438/437 |
| 5,940,717 A | 8/1999 | Rengarajan et al. ...... 438/435 |
| 5,950,090 A | 9/1999 | Chen et al. ............... 438/424 |
| 6,051,480 A | 4/2000 | Moore et al. ............. 438/435 |
| 6,482,717 B1 * | 11/2002 | Hahn ....................... 438/429 |

* cited by examiner

*Primary Examiner*—Bradley K Smith
(74) *Attorney, Agent, or Firm*—Lee & Morse, P.C.

(57) ABSTRACT

A trench isolation method for a semiconductor device, wherein a capping layer formed of an insulating material fills a recess generated at a border edge between an active area and an inactive area. The border edge is defined by a trench filled with insulating material. Filling the recess suppresses defects of the semiconductor device. Reduction of the isolating ability, due to the formation of gate poly residue during the forming of a gate, is prevented. Reduction of the threshold voltage of a transistor, caused by electric field concentration due to the gate poly residue, is suppressed. An oxide layer is also provided which protects an nitride pad during a plasma process.

2 Claims, 4 Drawing Sheets

TRENCH ISOLATION METHOD WITH AN EPITAXIALLY GROWN CAPPING LAYER

RELATED APPLICATION

This application is a divisional of U.S. patent application Ser. No. 09/324,919 filed Jun. 3, 1999, U.S. Pat. No. 6,255,194.

BACKGROUND OF THE INVENTION

1. Field of the Invention

The present invention relates to a fabrication method of a semiconductor device and, more particularly, to a trench isolation method for a semiconductor device.

2. Description of the Related Art

A process of forming an isolation area is initially performed in manufacturing a semiconductor device and is important in determining the size of an active area and a process margin. As the level of integration of a semiconductor device increases, the isolation area becomes smaller, such that a 64M DRAM requires 0.45 micron technology and a 256M DRAM requires 0.25 micron technology. Accordingly, a trench isolation method in which the isolation can be realized in a small area has been widely used.

FIGS. 1 and 2 are sectional views for illustrating a conventional trench isolation.

As shown in FIG. 1, a pad oxide layer 13 and a mask layer 14 defining an active area are sequentially formed on a semiconductor substrate 10. Here, the mask layer 14 is typically formed of a nitride. Then the pad oxide layer 13 and the semiconductor substrate 10 are etched by anisotropic dry-etching using the mask layer 14 as an etching mask, to thereby form a trench 12. Next, to recover damages which were generated during the anisotropic dry-etching a thermal process is performed. Here, a thermal oxide layer 15 is formed on the inner walls of the trench by the thermal process. Preferably, the thickness of the thermal oxide layer 15 is controlled in relation to the depth of the formed trench 12.

In sequence, the pad nitride layer 16 is formed in the trench 12, and then the insulating material 18 is filled therein. The pad nitride layer 16 is formed to relieve a stress which will be generated, during a later thermal process, by the insulating material 18 having a thermal expansion coefficient different from that of the semiconductor substrate.

Referring to FIG. 2, chemical mechanical polishing (CMP) is performed on the entire surface of the semiconductor substrate 10 on which the insulating material 18 is formed until the top surface of the mask layer 14 is exposed using the mask layer 14 as a polishing stopper. When the mask layer 14 exposed through polishing is removed, the trench isolation process by which the active area and the inactive area are divided is completed.

As described above, the conventional trench isolation methods in which two types of material layers lining the inside of the trench 12, ire., the thermal oxide layer 15 and the pad nitride layer 16, are formed before the trench 12 is filled with the insulating material 18 has problems as follows. That is, while the mask layer 14 formed of a nitride layer is removed by phosphorus, the pad nitride layer 16 is partially etched to thereby form an undesirable recess 19 in the trench 12. The recess 19 causes generation of gate poly residue later when a gate is formed, which deteriorates the isolation.

Also, gate poly formed by the later process is filled in a trench edge portion in which the recess 19 is formed. Thus, an active region of the semiconductor substrate 10 is surrounded with the gate poly, so that an electric field is concentrated on the edge of the trench. Accordingly, a threshold voltage of a transistor is dropped. Each of the semiconductor devices requires an optimum threshold voltage. Thus, the drop in the threshold voltage deteriorates the reliability of the semiconductor device. When the threshold voltage value drops below the optimum value, the transistor may malfunction at a low voltage of the optimum operational voltage or less, or charge stored in the capacitor may be lost. The loss of charge means damage to data in a memory cell. This requires that the refresh cycles, in which the lost charge is compensated to keep the data accurate, be shortened.

Two types of U.S. patents have been proposed to solve the above problems as follows.

U.S. Pat. No. 5,436,488 discloses that the reproducibility of an integrated circuit can be increased by increasing the thickness of a gate dielectric layer surrounding a trench corner. In detail, after a trench isolation area has been formed, a thin silicon dioxide ($SiO_2$) film is deposited on the trench isolation area and on an active area adjacent thereto by chemical vapor deposition (CVD). Then, the gate electrode of a transistor is formed on the thin $SiO_2$ film. The thin $SiO_2$ film is interposed between the gate electrode and the trench corner of the transistor. This increases the thickness of the gate dielectric layer, so that the breakdown voltage of the gate dielectric layer is increased at the trench corner.

U.S. Pat. No. 5,447,884 discloses a method for shallow trench isolation which used a nitride liner of 5 nm thickness or less. The nitride liner of 5 nm thickness or less prevents recessing of the nitride liner caused by undesirable voids in the filling material of the trench. During a densification of a thermal oxide layer, in which annealing is performed at 800° C., impurities are removed. Densification as high as that obtained from argon annealing at 1,000° C. can be obtained and thermal load can nearly completely be excluded.

However, in the first U.S. patent, $SiO_2$ is used as a trench liner, and a capping layer filled into a recess generated in a trench corner is formed of $SiO_2$. In the second patent, even though the problems described in the conventional trench isolation method are solved by forming a nitride layer, other problems are presented. First, when the nitride liner is thicker than a predetermined thickness it cannot be used as a gate dielectric layer in an active area. Second, when the nitride layer liner is too thin the nitride layer is undesirably consumed during a pre-plasma process which is performed to enhance the uniformity of USG growth. This undesirable consumption causes oxidation in an oxide layer, under the nitride layer for removing the stress, which deteriorates the performance characteristics of the semiconductor device.

The present invention is directed to overcoming or at least reducing the effects of one or more of the problems set forth above.

SUMMARY OF THE INVENTION

To solve the above problems, it is an objective of the present invention to provide a trench isolation method by which a predetermined material layer including a nitride layer is formed on the inner walls of a trench before filling the trench with an insulating material, and by which a recess formed by partially etching a pad nitride layer while a mask layer formed of a nitride layer is removed by phosphorus, is filled, to thereby suppress isolating ability from being deteriorated due to gate poly residue during forming a gate and a threshold voltage of a transistor from being deteriorated.

One of the trench isolation methods according to the present invention is as follows.

A trench is formed in a semiconductor substrate using a mask pattern defining an active area. Subsequently, an oxide layer and a nitride pad layer are sequentially stacked on the sidewall of the trench and an insulation layer is formed in the trench. The mask pattern is removed to expose the upper surface of the semiconductor substrate of the active area. A capping layer of an insulating material is formed, the capping layer filling a recess at the upper edge of the trench, the recess generated by etching the nitride padding layer formed on the sidewalls of the trench during removing the mask pattern.

Another of the trench isolation methods according to the present invention is as follows.

A trench is formed in a semiconductor substrate using a mask pattern defining an active area. Subsequently, a first oxide layer, a nitride pad layer and a second oxide layer are sequentially stacked on the sidewall of the trench and an isolation layer is formed in the trench. The mask pattern is removed to expose the upper surface of the semiconductor substrate of the active area. A capping layer of an insulating material is formed, the capping layer filling a recess at the upper edge of the trench recess generated by etching the nitride pad layer formed on the sidewalls of the trench during removal of the mask pattern.

Briefly, according to one aspect of the present invention, there is provided a trench isolation method comprising: forming a trench in a semiconductor substrate using a mask pattern defining an active area; sequentially stacking an oxide layer and a nitride pad layer on the sidewall of the trench and forming an insulation layer in the trench; removing the mask pattern down to the upper surface of the semiconductor substrate of the active area; and forming a capping layer of an insulating material, the capping layer filling a recess at the upper edge of the trench, the recess generated by etching the nitride pad layer formed on the sidewalls of the trench during removing the mask pattern.

Briefly, according to another aspect of the present invention, there is provided a trench isolation method comprising: forming a trench in a semiconductor substrate using a mask pattern defining an active area; sequentially stacking a first oxide layer, a nitride pad layer and a second oxide layer on the sidewall of the trench and forming an isolation layer in the trench; removing the mask pattern to expose the upper surface of the semiconductor substrate of the active area; and forming a capping layer of an insulating material, the capping layer filling a recess at the upper edge of the trench recess generated by etching the nitride pad layer formed on the sidewalls of the trench during removal of the mask pattern.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PREFERRED EMBODIMENT

Figure 1:
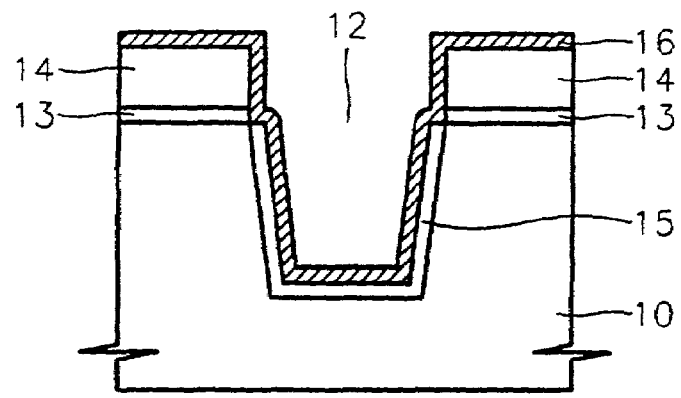
FIGS. 1 and 2 are sectional views showing a conventional trench isolation method.

Korean Application No. 9-740703, filed Aug. 25, 1997, discloses the same subject matter as the present application and is hereby incorporated by reference as if fully set forth herein.

The present invention will now be described more fully hereinafter with reference to the accompanying drawings, in which preferred embodiments of the invention may, however, be embodied in many different forms and should not be construed as limited to the embodiments set forth herein. Rather, these embodiments are provided so that this disclosure will be thorough and complete and will fully convey the scope of the invention to those skilled in the art. In the drawings, the thickness of layers and regions are exaggerated for clarity. It will also be understood that when a layer is referred to as being "on" or "above" another layer or substrate, it can be directly on the other layer or substrate, or intervening layers may also be present. Similarly, when a layer is referred to as being "under" or "below" another layer or substrate, it can be directly under the other layer or substrate, or intervening layers may also be present.

Embodiment 1

Figure 2:
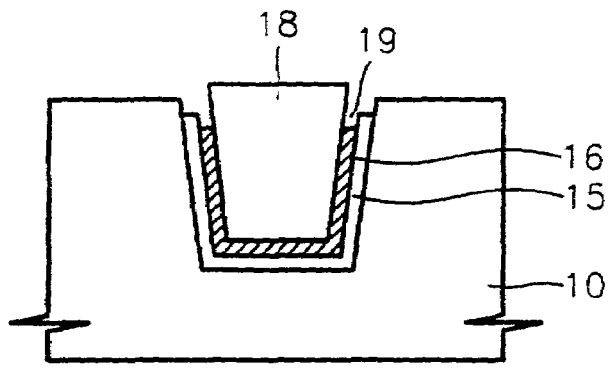

In the first embodiment, in a manner similar to the conventional trench isolation method shown in FIGS. 1 and 2, a trench 12 is formed using a mask pattern 14 defining an active area, a thermal oxide layer 15 and a pad nitride layer 16 are sequentially formed lining the side walls of the trench 12, the trench 12 is filled with an insulating material 18, and the resultant structure where the insulating material is formed is planarized using the mask pattern 14 as a planarization stopping layer. Subsequently, the mask pattern 14 is removed by wet-etching. Preferably, the mask pattern 14 consists of a nitride layer.

As shown in FIG. 2, the pad nitride layer 16 is partially etched while the mask pattern 14 formed of a nitride layer is removed by phosphorus. As a result, the thermal layer 15 on the upper wall of the trench covered with the pad nitride layer 16 is undesirably exposed.

Hereinafter, the process after removing the mask pattern 14 by wet-etching will be described with reference to FIG. 3. The exposed thermal oxide layer 15 is removed by usual wet-etching to expose the upper surface of the active area of the semiconductor substrate 10. Then a capping layer 22 is formed on the exposed semiconductor substrate 10 through self epitaxial growth (SEG). When the capping layer 22 is formed of a material growing only on the semiconductor substrate 10, the capping layer 22 is grown upward from the exposed semiconductor substrate 10 and sidewards from the trench corner thereof. In this manner, the recess (19 of FIG. 2) generated during removal of the pad nitride layer 16 is filled. The thickness of the capping layer 22 formed through SEG may be changed in accordance with the thickness of the thermal oxide layer 15 and the pad nitride layer 16, and the depth of the recess 19 (of FIG. 2) generated by removing the pad nitride layer 16.

Considering isolation related to the high integration of the semiconductor device, the pad nitride layer 16 formed with a thickness of 50-250 Å using low pressure chemical vapor deposition (LPCVD) can realize characteristics of the semiconductor isolation. Preferably, the thickness of the thermal oxide layer 15 is from 50-250 Å, corresponding to the thickness of the pad nitride layer 16.

Filling the recess 19 (of FIG. 2) with a material growing only on the exposed surface of the semiconductor substrate 10 has several advantages. First, the problem of deteriorating the isolation of the semiconductor device, due to the recess 19 generated by removing the mask pattern 14, is solved. Second, the thickness of the pad nitride layer 16 has a significant effect in stopping the stress applied to the sidewalls of the trench. Third, the polysilicon residue can be prevented from remaining in the later process. The recess 19 is buried by forming the capping layer 22. This can prevent the gate poly residue from remaining in the next gate process and, thus, the threshold voltage of the transistor is prevented from dropping.

Embodiment 2

In the second embodiment like in the first embodiment, a trench 12 is formed using a mask pattern 14 defining an active area, the trench 12 is filled with an insulating material 18, and then the resultant structure where the insulating material is formed is planarized using the mask pattern 14 as a planarization stopping layer. Subsequently, the mask pattern 14 is removed by wet-etching. Hereinafter, the process after removing the mask pattern 14 by wet-etching will be described with reference to FIGS. 4 and 5.

As described above, the trench is filled with the insulating material 18, e.g., a CVD oxide, or a high density plasma deposition (HDP) oxide, and then the pad nitride layer 16 is partially etched while the mask pattern 14 formed of a nitride layer is removed by phosphorus, to thereby form a recess 19 (of FIG. 2) in the trench area.

Figure 4:
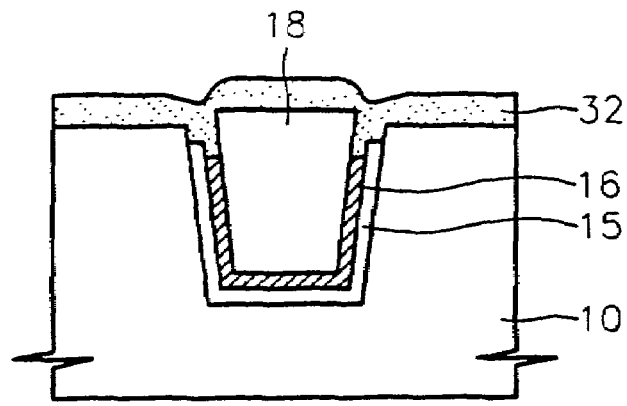
FIGS. 4 and 5 are sectional views showing a second embodiment according to a trench isolation method of the present invention.
Figure 5:
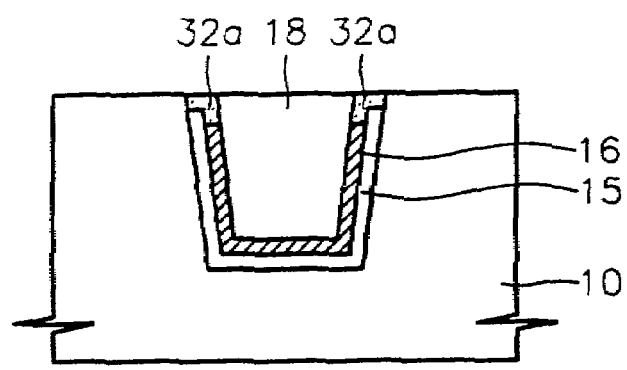

To fill the recess 19 (of FIG. 2), a capping layer 32 is formed of a material selected from the group consisting of an oxide, a nitride and an oxynitride, e.g., a CVD oxide, a SiN or a SiON, using usual chemical vapor deposition (CVD) as shown in FIG. 4. The capping layer is formed on the entire surface of the semiconductor substrate 10, so that it is formed on the active area as well as in the trench filled with the insulating material 18. The capping layer covering the active area must be removed for a next process, in which dry-etching is typically used. Here, dry-etching is performed on the entire surface of the semiconductor substrate 10 including the active area. Hence, the recess 19 (of FIG. 2) formed by the conventional trench isolation as shown in FIG. 4 is filled with the capping layer 32a, and the step coverage between the active area and the inactive area on the semiconductor substrate can be reduced.

Embodiment 3

The third embodiment is a little different from the first and the second embodiments, but they are the same in the essence of the invention. That is, in the third embodiment like in the first and second embodiments, the undesirable recess formed during the forming of a trench and filling the trench is buried.

Figure 6:
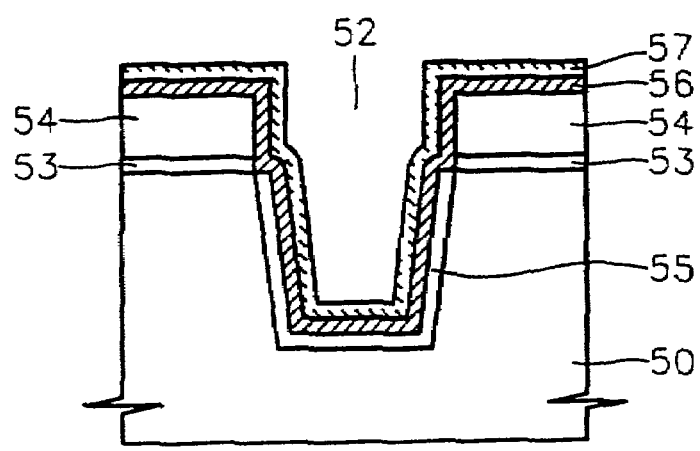
FIGS. 6 through 8 are sectional views showing a third embodiment according to a trench isolation method of the present invention.

As shown in FIG. 6, a typical pad oxide layer 53 is formed on the semiconductor substrate 50 onto which a mask pattern 54 is formed, where preferably the mask pattern 54 is formed of a nitride layer. The pad oxide layer 53 and the semiconductor substrate 50 are etched by anisotropic dry-etching, using the mask pattern 54 as an etching mask to thereby form a trench 52.

When anisotropic etching is performed to form the trench 52, the semiconductor substrate 50 is damaged. The damaged semiconductor substrate is typically recovered through a thermal process, where a first oxide layer 55 is typically formed on the sidewall of the trench 52. Here, preferably, the thickness of the first oxide layer 55 is controlled to correspond to the depth of the trench. In sequence, pad nitride layer 56 and the second oxide layer 57 are formed. The reasons for forming the pad nitride layer 56 and the second oxide layer 57 are as follows.

The trench is generally filled with a predetermined insulating material 58 (of FIG. 7), e.g., a CVD oxide layer or an HDP oxide, where the insulating material 58 (of FIG. 7) has a wet-etch rate higher than that of the other material layers. Thus, it is preferable to perform the thermal process in the later part of the process. The insulating material 58 (of FIG. 7) buried in the trench 52 has a thermal expansion coefficient different from that of the semiconductor substrate 50, so that the volume of insulating material 58 during a thermal process for controlling the wet-etch rate may be expanded or contracted differently from that of the semiconductor substrate 50. Thus, stress is applied to the semiconductor substrate 50, which causes crystal defect or dislocation in the semiconductor substrate 50. The crystal defect or the dislocation may cause leakage current and, in particular, may deteriorate the threshold voltage of a typical semiconductor device, i.e., a transistor.

The first oxide layer 55 has limitations in the reduction of stress applied to the semiconductor substrate 50, during the later thermal process, by the insulating material 58 (of FIG. 7) which fills the trench. Thus, the pad nitride layer 56 is additionally formed on the first oxide layer 55. The pad nitride layer 56 is typically formed by LPCVD. Thus, as shown in FIG. 6, the first oxide layer 55 and the pad nitride layer 56 are sequentially formed on the inner walls of the trench 52.

Meanwhile, the insulating material 58 (of FIG. 7) which fills the trench 52 depends on an underlying layer. The dependence prevents the insulating material 58 from completely filling the trench 52. Accordingly, a plasma process using NH$_3$ is performed on the inner walls of the trench 52 before the insulating material 58 of FIG. 7 fills the trench. Here, all or part of the pad nitride layer 56 may be removed. Thus, the stress relieving function of the pad nitride layer 56 cannot be sufficiently performed. The second oxide layer 57 covering the upper surface of the pad nitride layer 56 is formed to a predetermined thickness, to thereby protect the pad nitride layer 56 during the plasma process.

Preferably, the pad nitride layer 56 is formed to a thickness of 50-250 Å for the purpose of highly integrating a semiconductor device, and first and second oxide layers 55 and 57 are formed to the thickness of 50-250 Å for the purpose of maintaining the trench isolation function and solving the conventional problems.

Figure 7:
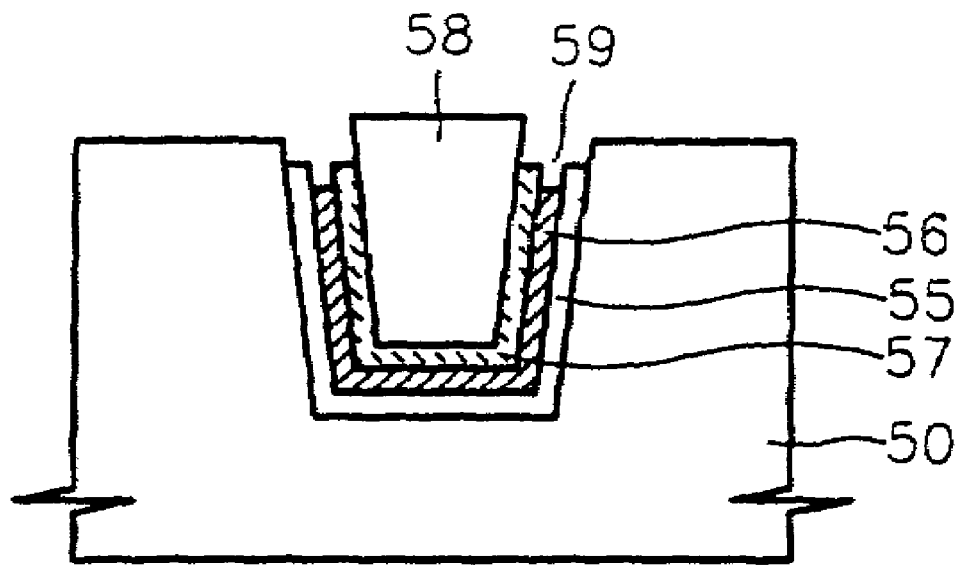

In FIG. 7, the insulating material 58 fills the trench 52 which is covered by the first oxide layer 55, the pad nitride layer 56 and the second oxide layer 57. Preferably, the insulating material 58 is formed of an undoped silicate glass (USG) having an excellent step coverage, tetra-ethyl-orthosilicate (TEOS), a CVD oxide or an HDP oxide, and the thickness of the insulating material layer 58 can be controlled to correspond to the depth of the trench.

Then, in the semiconductor substrate 50 filled with the insulating material 58, a planarization process using the mask pattern 54 (of FIG. 6) as a planarization stopping layer is performed. Preferably, the planarization is performed by chemical mechanical polishing (CMP). Subsequently, the mask pattern 54 (of FIG. 6) including the pad oxide layer 53 (of FIG. 6) having the polished upper surface is removed by wet-etching, to expose the upper portion of the active area of the semiconductor substrate. At this time, the pad nitride layer 56 (of FIG. 6) is partially etched while the mask pattern 54 (of FIG. 6) is removed, to thereby generate a recess 59 (of FIG. 7) in the trench area.

Figure 3:
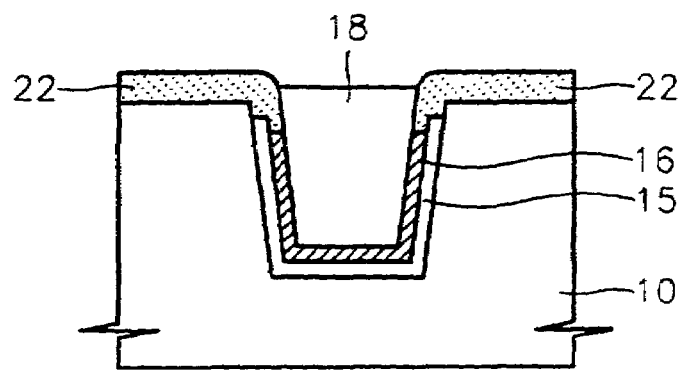
FIG. 3 is a sectional view showing a first embodiment according to a trench isolation method of the present invention.
Figure 3A:
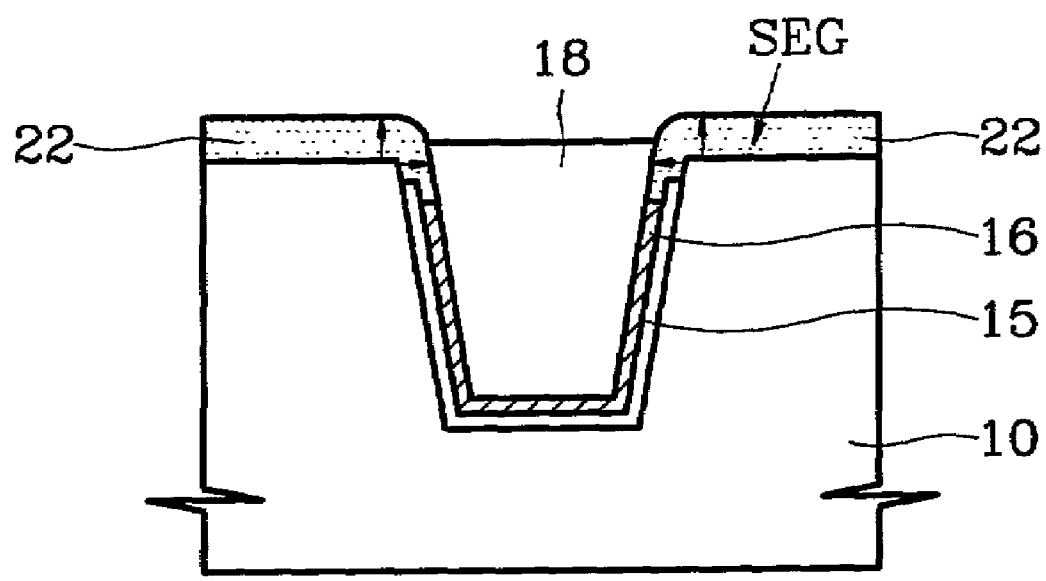
Figure 3B:
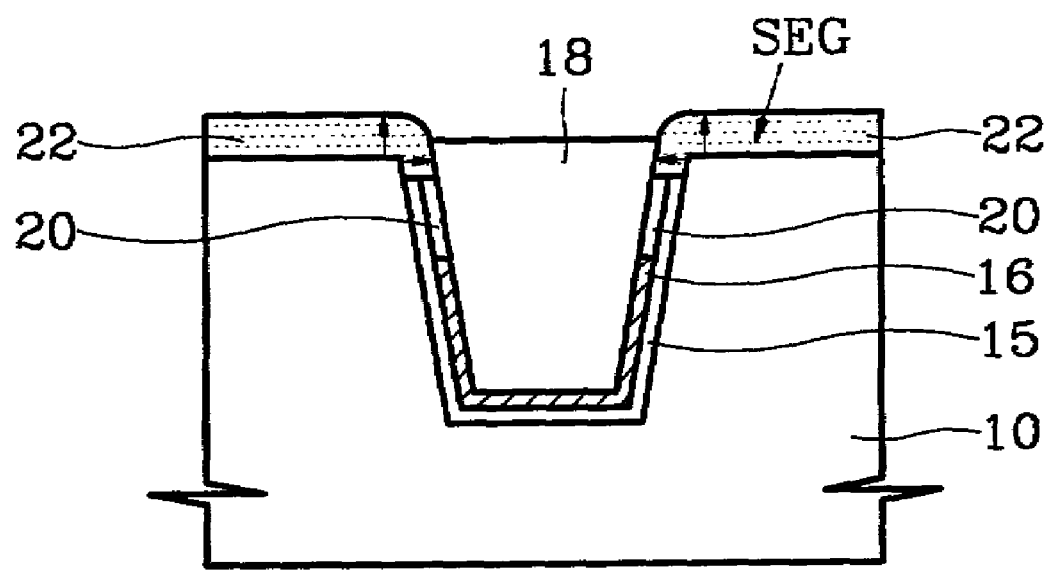
Figure 8:
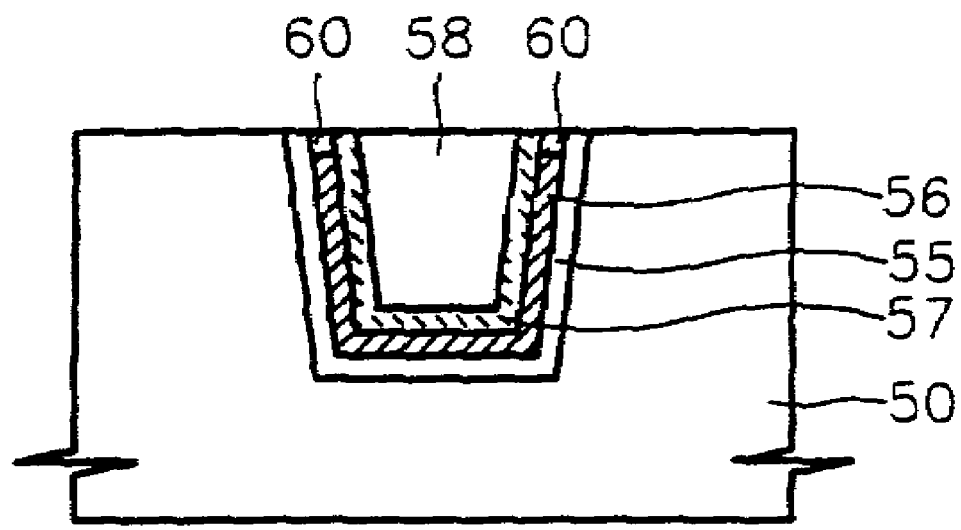

In FIG. 8, the same process as that illustrated in FIGS. 3 or 4 is performed on the substrate of the resultant structure illustrated in FIG. 7, and then planarization is performed on the substrate of the resultant structure. As shown in FIG. 8, a capping layer 60 burying the recess 59 at the upper edge of the trench is formed.

In the drawings and specification, there have been disclosed typical preferred embodiments of the invention and, although specific terms are employed, they are used in a generic and descriptive sense only and not for purposes of limitation, the scope of the invention being set forth in the following claims.

As described above, according to the trench isolation of the present invention, the recess in the trench is prevented, so that the isolating ability is prevented from being reduced due to gate poly residue during forming of the gate, and the threshold voltage of the transistor is prevented from being reduced due to concentration of the electric field, which is caused by the gate poly filling in the recess. Therefore, the isolation area in accordance with high integration of the semiconductor device is reduced and a reliable semiconductor device can be manufactured.

The invention claimed is:

1. A trench isolation method comprising:

forming a trench in a semiconductor substrate using a mask pattern defining an active area;

sequentially stacking an oxide layer and a nitride pad layer on the sidewall of the trench and forming an insulation layer in the trench;

removing the mask pattern down to the upper surface of the semiconductor substrate of the active area; and forming a capping layer of an insulating material, the capping layer filling a recess at the upper edge of the trench, the recess generated by etching the nitride pad layer formed on the sidewalls of the trench during removing the mask pattern, wherein the capping layer is formed by forming an insulating material by self epitaxial growth (SEG), and then removing the insulating material layer down to the upper surface of the semiconductor substrate of the active area so that only the insulating material layer filled in the recess is exposed.

2. A trench isolation method comprising:

forming a trench in a semiconductor substrate using a mask pattern defining an active area;

sequentially stacking a first oxide layer, a nitride pad layer and a second oxide layer on the sidewall of the trench and forming an isolation layer in the trench;

removing the mask pattern to expose the upper surface of the semiconductor substrate of the active area; and forming a capping layer of an insulating material, the capping layer filling a recess at the upper edge of the trench recess generated by etching the nitride pad layer formed on the sidewalls of the trench during removal of the mask pattern, wherein the capping layer is formed by forming an insulating material layer by self epitaxial growth (SEG), and then removing the insulating material layer down to the upper surface of the semiconductor substrate of the active area so that only the insulating material layer filled in the recess is exposed.

* * * * *